United States Patent
Wu et al.

(10) Patent No.: US 11,944,013 B2
(45) Date of Patent: Mar. 26, 2024

(54) MAGNETIC TUNNEL JUNCTION DEVICE WITH MINIMUM STRAY FIELD

(71) Applicant: INTERNATIONAL BUSINESS MACHINES CORPORATION, Armonk, NY (US)

(72) Inventors: Heng Wu, Guilderland, NY (US); Dimitri Houssameddine, Sunnyvale, CA (US); Huai Huang, Clifton Park, NY (US); Tianji Zhou, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 17/447,937

(22) Filed: Sep. 17, 2021

(65) Prior Publication Data

US 2023/0091345 A1    Mar. 23, 2023

(51) Int. Cl.
*H10N 50/01* (2023.01)
*G11C 11/16* (2006.01)
(Continued)

(52) U.S. Cl.
CPC ........... *H10N 50/01* (2023.02); *G11C 11/161* (2013.01); *H01L 21/76802* (2013.01); *H01L 21/76883* (2013.01); *H01L 23/5226* (2013.01); *H10B 61/00* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| 6,166,948 A | 12/2000 | Parkin |
|---|---|---|
| 7,241,514 B2 | 7/2007 | Kagami |

(Continued)

FOREIGN PATENT DOCUMENTS

| WO | 2018125248 A1 | 7/2018 |
|---|---|---|
| WO | 2023041530 A1 | 3/2023 |

OTHER PUBLICATIONS

Notification of Transmittal of the International Search Report and the Written Opinion of the International Searching Authority, or the Declaration, dated Feb. 7, 2023, International application No. PCT/EP2022/075419, 9 pages.

*Primary Examiner* — Alexander G Ghyka
(74) *Attorney, Agent, or Firm* — L. Jeffrey Kelly; Yuanmin Cai

(57) ABSTRACT

A second BEOL layer including a via dielectric layer surrounding a via including an upper metal stud and a lower metal stud separated by a liner, and a magnetic tunnel junction (MTJ) stack aligned above the via. A first back end of line (BEOL) layer including a BEOL dielectric layer surrounding a BEOL metal layer, a second BEOL layer including a via dielectric layer surrounding a via including an upper metal stud and a lower metal stud separated by a liner, a magnetic tunnel junction (MTJ) stack aligned above the via. Forming a via dielectric layer as a second back end of line (BEOL) layer, an opening, a lower metal stud in the opening, a liner on the lower metal stud and on exposed side surfaces of the opening, an upper metal stud in remaining portions of the opening, and forming a magnetic tunnel junction (MTJ) stack aligned above.

9 Claims, 11 Drawing Sheets

(51) Int. Cl.
*H01L 21/768* (2006.01)
*H01L 23/522* (2006.01)
*H10B 61/00* (2023.01)
*H10N 50/10* (2023.01)
*H10N 50/80* (2023.01)
*H10N 50/85* (2023.01)

(56) References Cited

U.S. PATENT DOCUMENTS

| | | |
|---|---|---|
| 8,576,616 B2 | 11/2013 | Saida |
| 9,024,399 B2 | 5/2015 | Guo |
| 9,514,983 B2 | 12/2016 | Jezewski |
| 10,686,126 B2 | 6/2020 | Maniscalco |
| 10,707,413 B1 | 7/2020 | Dutta |
| 2019/0305216 A1 | 10/2019 | Gosavi |
| 2020/0098976 A1* | 3/2020 | Jacob .................. H10N 50/01 |
| 2020/0321394 A1 | 10/2020 | Hashemi |
| 2020/0350494 A1 | 11/2020 | Dutta |

* cited by examiner

MAGNETIC TUNNEL JUNCTION DEVICE WITH MINIMUM STRAY FIELD

BACKGROUND

The present invention relates, generally, to the field of semiconductor manufacturing, and more particularly to fabricating a magnetic tunnel junction device with minimum stray field from underline ferromagnetic structures.

Magnetoresistive random-access memory ("MRAM") devices are used as non-volatile computer memory. MRAM data is stored by magnetic storage elements. The elements are formed from two ferromagnetic layers, each of which can hold a magnetic field, separated by a spin conductor layer. One of the two layers is a reference magnet or a reference layer set to a particular polarity, while the remaining layer's field can be changed to match that of an external field to store memory and is termed the "free magnet" or "free-layer". This configuration is known as the magnetic tunnel junction (MTJ) and is the simplest structure for a MRAM bit of memory.

Cobalt (Co) is an emerging metal option in advanced interconnection technology, due to no extra liner needed for metal filling compared with copper (Cu) in Back End of Line (BEOL) manufacturing and much lower resistivity than tungsten (W) in Middle of Line (MOL) manufacturing. Cobalt is ferromagnetic, which has a high susceptibility to magnetization with a strong stray electromagnetic field.

SUMMARY

According to an embodiment, a semiconductor device is provided. The semiconductor device including a second BEOL layer including a via dielectric layer surrounding a via, the via including an upper metal stud and a lower metal stud, the upper metal stud and the lower metal stud separated by a liner, and a magnetic tunnel junction (MTJ) stack aligned above the via.

According to an embodiment, a semiconductor device is provided. The semiconductor device including a first back end of line (BEOL) layer including a BEOL dielectric layer surrounding a BEOL metal layer, a second BEOL layer directly on the first BEOL layer, the second BEOL layer including a via dielectric layer surrounding a via, the via including an upper metal stud and a lower metal stud, the upper metal stud and the lower metal stud separated by a liner, the BEOL metal layer aligned with the via, and a magnetic tunnel junction (MTJ) stack aligned above the via.

According to an embodiment, a method is provided. The method including forming a via dielectric layer as a second back end of line (BEOL) layer, forming an opening through the via dielectric layer, forming a lower metal stud in a portion of the opening, forming a liner on the lower metal stud and on exposed side surfaces of remaining portions of the opening, forming an upper metal stud in remaining portions of the opening; and forming a magnetic tunnel junction (MTJ) stack aligned above the upper metal stud.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
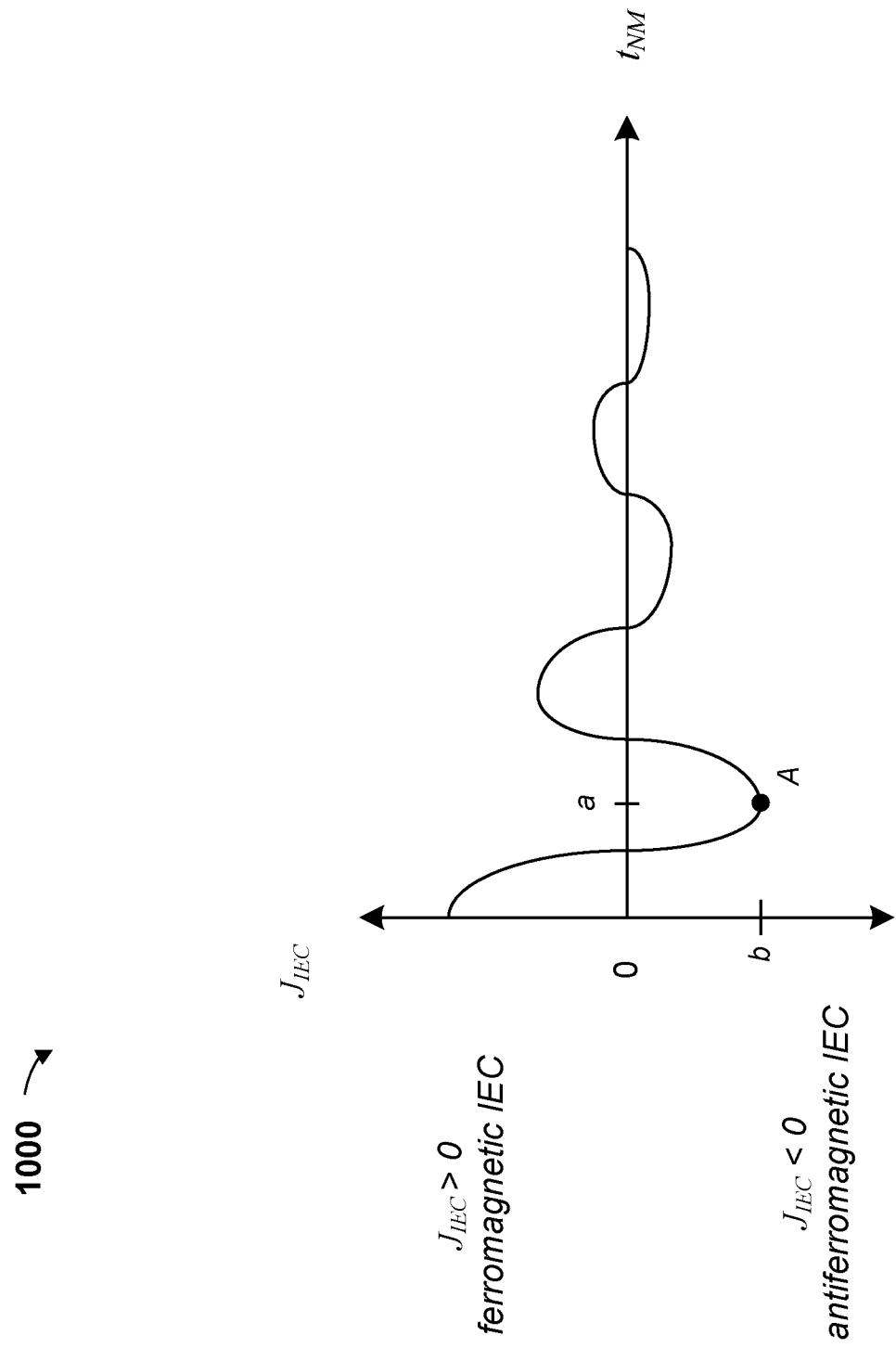
FIG. 1 illustrates a graph of oscillatory interlayer exchange coupling as a function of a thickness of a non-magnetic layer between two ferromagnetic layers, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As stated above, magnetoresistive random-access memory (hereinafter "MRAM") devices are a non-volatile computer memory technology. MRAM data is stored by magnetic storage elements. The elements are formed from two ferromagnetic layers, each of which can hold a magnetic field, separated by a spin conductor layer. One of the two layers is a reference magnet or a reference layer set to a particular polarity, while the remaining layer's field can be changed to match that of an external field to store memory and is termed the "free magnet" or "free-layer". The magnetic reference layer may be referred to as a reference layer, and the remaining layer may be referred to as a free layer. This configuration is known as the magnetic tunnel junction (hereinafter "MTJ") and is the simplest structure for a MRAM bit of memory.

A memory device is built from a grid of such memory cells or bits. In some configurations of MRAM, such as the type further discussed herein, the magnetization of the magnetic reference layer is fixed in one direction (up or down), and the direction of the magnetic free layer can be switched by external forces, such as an external magnetic field or a spin-transfer torque generating charge current. A smaller current (of either polarity) can be used to read resistance of the device, which depends on relative orientations of the magnetizations of the magnetic free layer and the magnetic reference layer. The resistance is typically higher which the magnetizations are anti-parallel and lower when they are parallel, though this can be reversed, depending on materials used in fabrication of the MRAM.

The present application relates to magnetoresistive random access memory (MRAM). More particularly, the present application relates to an embedded MRAM (eMRAM), which is embedded between an M1 layer, metal layer 1, and an M2 layer, metal layer 2, which can be integrated into back-end-of-the-line (BEOL) as a magnetic tunnel junction (MTJ) structure and can be integrated into the back-end-of-the-line (BEOL) processing of semiconductor technologies (such as CMOS technologies).

One type of MRAM that can use MTJ is spin-transfer torque MRAM (hereinafter "MTT-MRAM"). STT MRAM has an advantage of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passed up through the MTJ structure makes the magnetic free layer anti-parallel to the magnetic reference layer.

In advanced Front End of Line (FEOL) technology, cobalt, Co, may be used for metal lines, vias, contacts and other areas which require electrical connection. Cobalt is ferromagnetic, which has a high susceptibility to magnetization with a strong stray electromagnetic field. When forming MTJ memory elements, cobalt in FEOL and Middle of Line (MOL) layers of a structure may adversely affect stored MTJ memory elements by affecting the bit-state of the MTJ memory element. The use of cobalt in the structure may impact thermal stability and reliability of the eMRAM applications.

The use of Co can introduce stray field in the MTJ region, changing a balance of the AP and P state of the MTJ. Depending on the direction of the stray field, the energy barrier of either AP or P state can be reduced, making the MTJ more vulnerable to thermal fluctuation, thus affecting the thermal stability. Memory elements in MTJ may be stored in an AP state (high resistance state) or in a P state (low resistance state).

Similar as the thermal stability, due to the energy barrier change caused by the stray field, reliability is affected by possible changing of stored MTJ memory element states.

The present invention relates, generally, to the field of semiconductor manufacturing, and more particularly to fabricating a magnetic tunnel junction device in a structure over FEOL and MOL layers, where any cobalt layers within the FEOL and MOL layers have a non-magnetic layer within the cobalt layer. This new FEOL and MOL metallization integration scheme can help reduce stray electromagnetic fields in a MTJ memory element for an eMRAM application.

Referring now to FIG. 1, a graph 1000 of oscillatory interlayer exchange coupling as a function of a thickness of a non-magnetic layer between two magnetic layers is shown according to an exemplary embodiment.

A thickness $t_{NM}$, is shown along the horizontal axis, which is the thickness of a non-magnetic layer between two ferromagnetic layers. The vertical axis is interlayer exchange coupling, $J_{IEC}$, which varies in an oscillatory pattern from a strong positive value, to a strong negative value, and oscillating from smaller and smaller peaks, positive and negative.

Values of $J_{IEC}$ which are positive indicate that for those corresponding thicknesses, $t_{NM}$, of the non-magnetic layer between two ferromagnetic layers, there is an influence of a magnetic field of a first layer of the two ferromagnetic layers on a second layer of the two ferromagnetic layers. In other words, if the first layer has a magnetic field, this magnetic field will influence a magnetic field of the second layer. Also, if the second layer has a magnetic field, this magnetic field will influence a magnetic field of the first layer. A greater value of $J_{IEC}$ indicates a magnetic field on either the first or second layer will more strongly influence a magnetic field on the second or first layer.

Values of $J_{IEC}$ which are negative indicate that for those corresponding thicknesses, $t_{NM}$, of the non-magnetic layer between two ferromagnetic layers, there is not an influence of a magnetic field of the first layer of the two ferromagnetic layers on the second layer of the two ferromagnetic layers. In other words, if the first layer has a magnetic field, this magnetic field will not influence a magnetic field of the second layer. Also, if the second layer has a magnetic field, this magnetic field will not influence a magnetic field of the first layer. A greater negative value of $J_{IEC}$ indicates a magnetic field on either the first or second layer will have less influence of a magnetic field on the other layer.

As shown in FIG. 1, the NM layer between the two ferromagnetic layers may enhance or increase a ferromagnetic field from each of the ferromagnetic layers on the other one, shown as an increase in coupling on the graph 1000, or may cause a cancellation or decrease of a ferromagnetic field from each of the ferromagnetic layers on the other one, as shown as a decrease, below 0, or cancelling of coupling on the graph 1000, fluctuating between an enhancing and decreasing effect. At increased thickness of $t_{NM}$, the two ferromagnetic layers may be decoupled, or have no affect on each other.

In an embodiment, a non-magnetic layer may be used when forming an electrical contact, electrical via, or a metal layer when forming a MTJ device, and the non-magnetic layer may have a thickness, $t_{NM}$, which has a least amount of influence of a magnetic field from one side of the non-magnetic layer to the other. The point A on the graph 1000, shows a point where there is the least amount of influence of a magnetic field between two magnetic layers through a non-magnetic layer which has a thickness, $t_{NM}$ equal to a value of a, where the value of $J_{IEC}$ which is the most negative, at a value of b.

Figure 2:
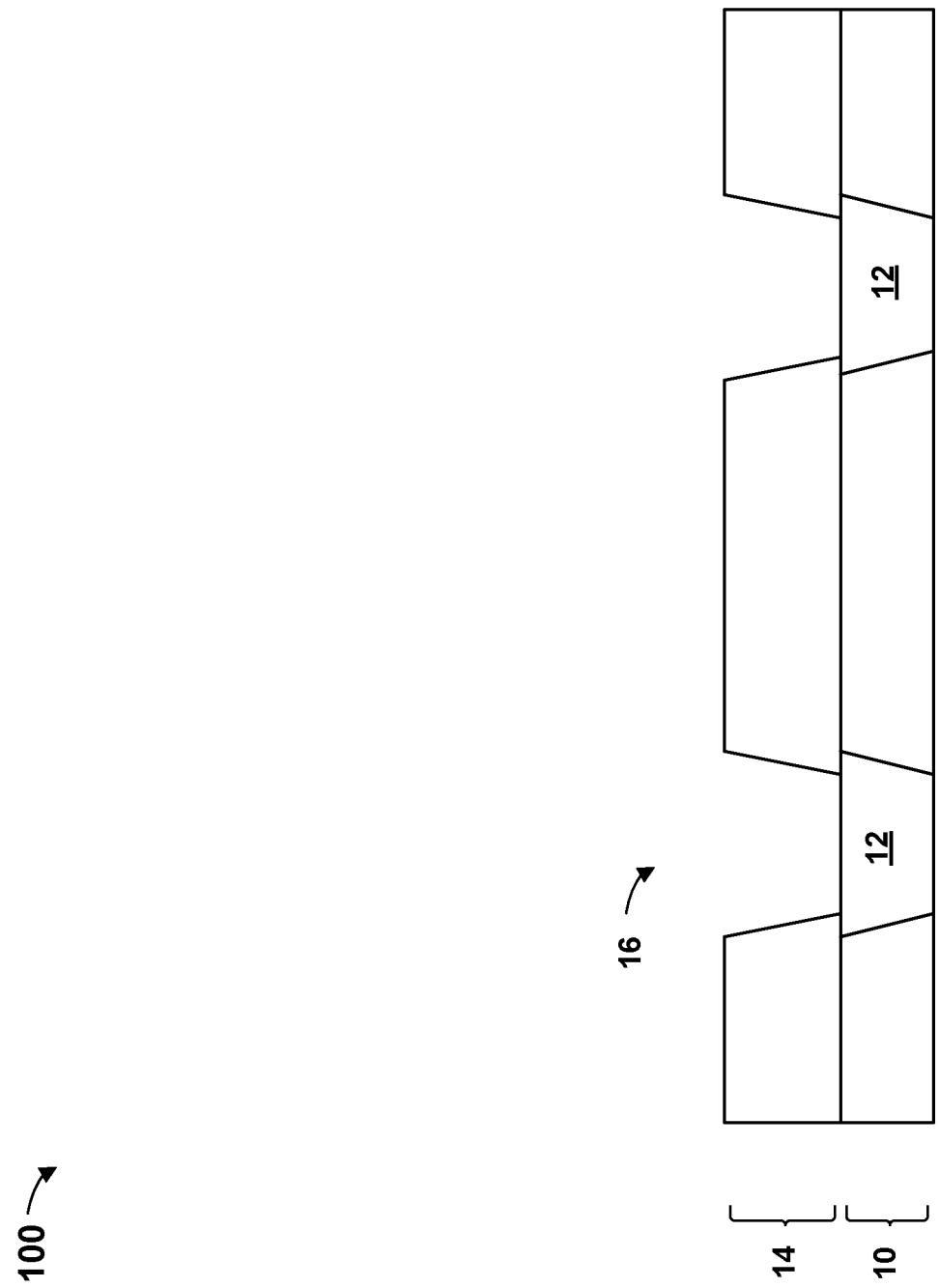
FIG. 2 illustrates a cross-sectional view of a semiconductor structure at an intermediate stage of fabrication, according to an exemplary embodiment.

Referring now to FIG. 2, a semiconductor structure 100 (hereinafter "structure") at an intermediate stage of fabrication is shown according to an exemplary embodiment. FIG. 1 is a cross-sectional view of the structure 100.

The structure 100 may include several back end of line ("BEOL") layers. In general, the back end of line (BEOL) is the second portion of integrated circuit fabrication where the individual devices (transistors, capacitors, resistors, etc.) are interconnected with wiring on the wafer. As shown in FIG. 2, a first BEOL layer includes a BEOL dielectric layer 10 surrounding a BEOL metal layer 12. A second BEOL layer formed on the first BEOL layer includes via dielectric layer 14.

The BEOL dielectric layer 10 may be formed by conformally depositing or growing a dielectric and performing an isotropic etch process. The BEOL dielectric layer 10 may include one or more layers. The BEOL dielectric layer 10 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Two openings (not shown) may be formed in the BEOL dielectric layer 10 by, for example, reactive ion etching (ME), and stopping on a layer below the first BEOL layer for subsequent filling with the BEOL metal layer 12. The BEOL metal layer 12 may be formed within the two openings (not shown) in the BEOL dielectric layer 10, using known techniques. The BEOL metal layer 12 can include, for example, copper (Cu), tantalum nitride (TaN), tantalum (Ta), titanium (Ti), titanium nitride (TiN), or a combination thereof. The BEOL metal layer 12 can be formed by for example, chemical vapor deposition (CVD), physical vapor deposition (PVD), and atomic layer deposition (ALD) or a combination thereof. There may be any number of openings in the BEOL dielectric layer 10, each filled with the BEOL metal layer 12, on the structure 100.

A planarization process, such as, for example, chemical mechanical polishing (CMP), may be done to remove excess material from a top surface of the first BEOL layer of the structure 100 prior to forming the second BEOL layer, such that upper horizontal surfaces of the BEOL dielectric layer 10 and the BEOL metal layer 12 are coplanar.

The second BEOL layer is formed on the first BEOL layer. The second BEOL layer includes the via dielectric layer 14.

The via dielectric layer 14 may be formed by conformally depositing or growing a dielectric and performing an isotropic etch process. The via dielectric layer 14 may include one or more layers. The via dielectric layer 14 is formed above the BEOL dielectric layer 10 and the BEOL metal layer 12. The via dielectric layer 14 may be made of substantially the same material as the BEOL dielectric layer 10.

An opening 16 may be formed in the BEOL via dielectric layer 14 as described above regarding the opening (now shown) formed in the first BEOL layer, and stopping on the BEOL metal layer 12 of the first BEOL layer. Two openings 16 are shown, however any number of openings 16 may be formed on the structure 100.

Figure 3:
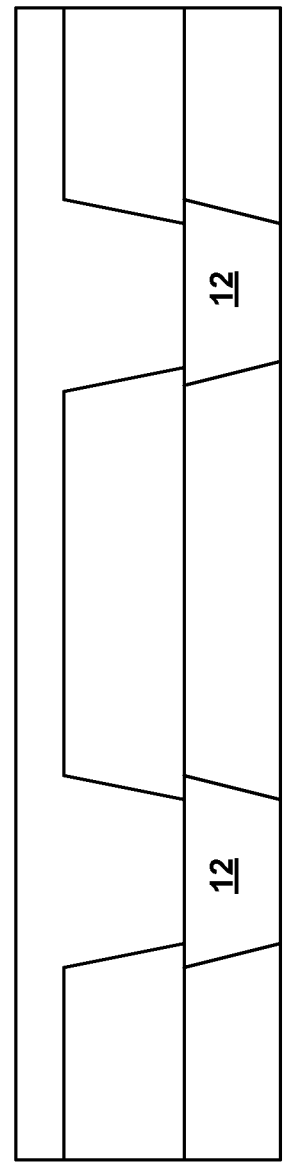
FIG. 3 illustrates forming a via fill layer, according to an exemplary embodiment.

Referring now to FIG. 3, the structure 100 is shown according to an exemplary embodiment. A first via fill layer 18 may be formed.

The first via fill layer 18 is formed within the opening 16 in the via dielectric layer 14. In certain embodiments, the first via fill layer 18 may include a material such as cobalt (Co), tungsten (W), copper (Cu), tantalum nitride (TaN), tantalum (Ta), titanium (Ti), titanium nitride (TiN), titanium oxide carbon nitride (TiOCN), tantalum oxide carbon (TaOCN), or a combination of these materials. The first via fill layer 18 can be formed by for example, CVD, PVD and ALD or a combination thereof.

In particular, the first via fill layer 18 is aligned with the BEOL metal layer 12, providing an electrical connection between the first via fill layer 18 and the BEOL metal layer 12.

After the first via fill layer 18 is formed, the structure 100 is subjected to, for example, CMP to planarize the surface for further processing, such that upper horizontal surfaces of via dielectric layer 106 and the via fill layer 108 are coplanar. The structure 100 including the BEOL layers shown in FIG. 2 is a starting structure upon which the MTJ stacks are to be formed.

Figure 4:
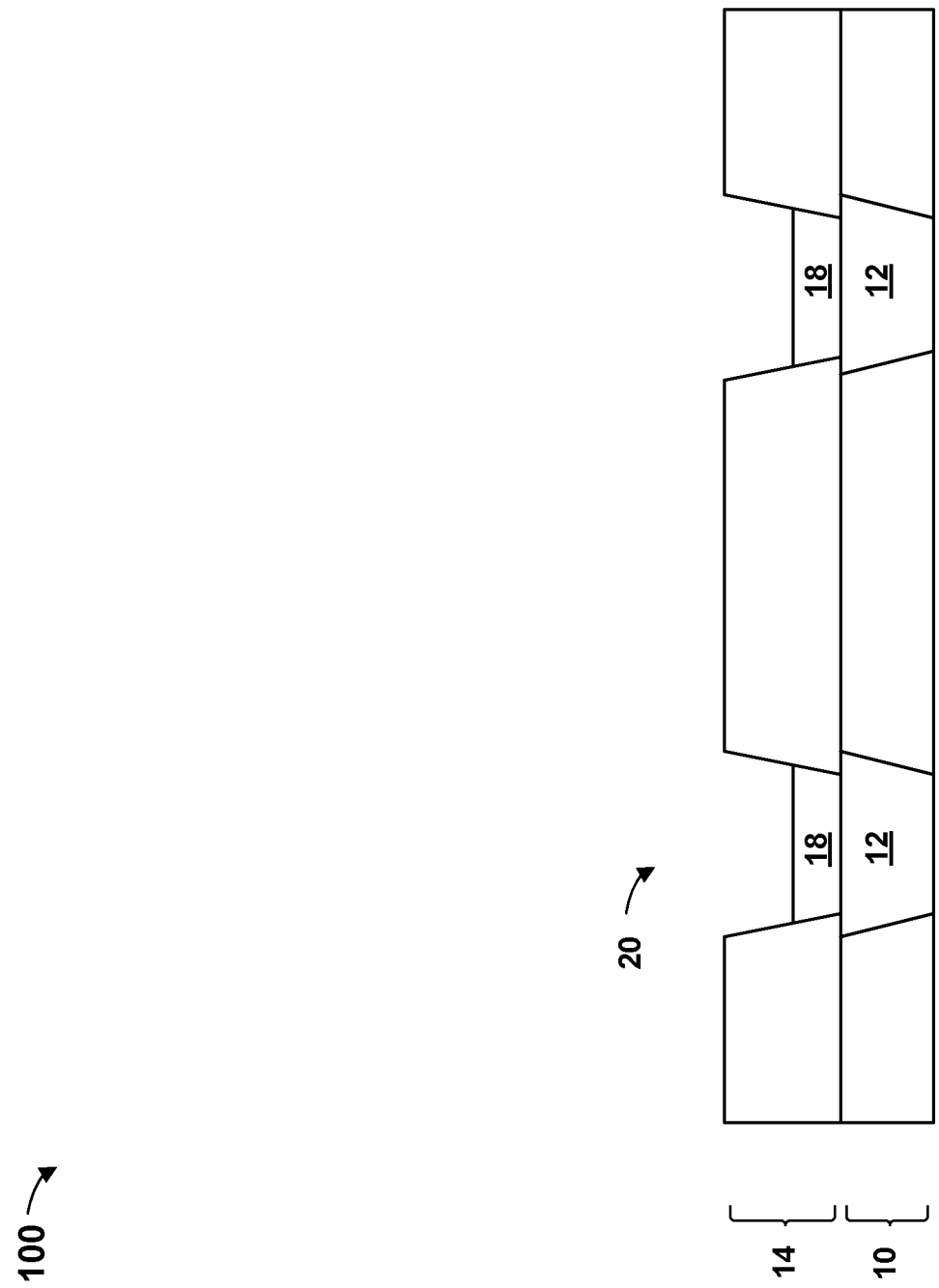
FIG. 4 illustrates recessing a portion of the via fill layer, according to an exemplary embodiment.

Referring now to FIG. 4, the structure 100 is shown according to an exemplary embodiment. The first via fill layer 18 may be recessed.

A planarization process, such as, for example, chemical mechanical polishing (CMP), may be done to remove excess material from a top surface of the second BEOL layer of the structure 100, such that upper horizontal surfaces of the via dielectric layer 14 and the first via fill layer 18 are coplanar.

The first via fill layer 18 may be recessed, forming a second opening 20. The first via fill layer 18 may be recessed selective to the via dielectric layer 14, such that an upper surface of the first via fill layer 18 is below an upper surface of the via dielectric layer 14. The first via fill layer 18 may be recessed by methods known in the art, such as dry or wet etch.

Figure 5:
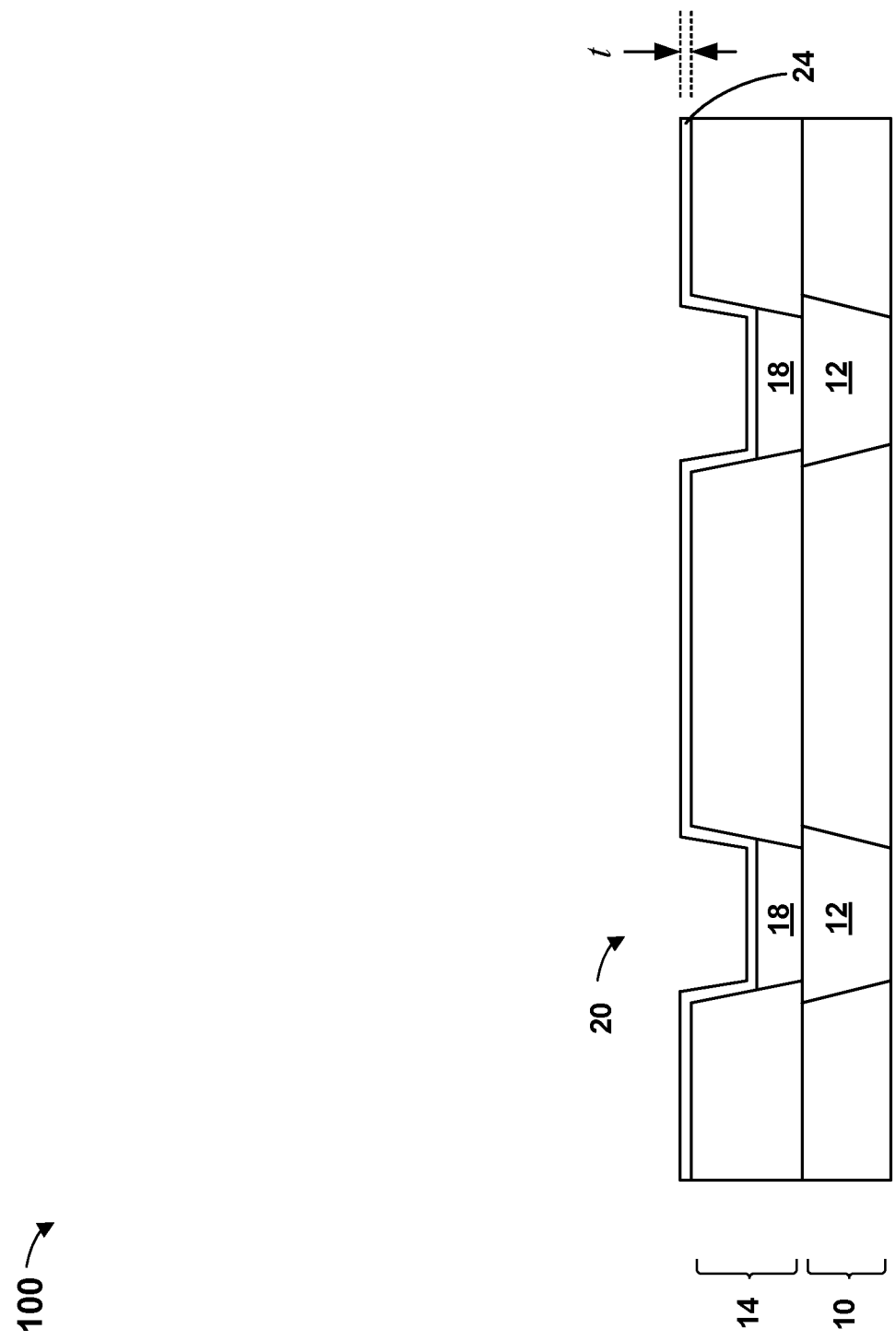
FIG. 5 illustrates forming a liner, according to an exemplary embodiment.

Referring now to FIG. 5, the structure 100 is shown according to an exemplary embodiment. A liner 24 may be formed.

The liner 24 may be conformally deposited on the structure 100, on upper and side surfaces of the via dielectric layer 14 and on an upper surface of the first via fill layer 18. The liner 24 may be composed of, for example, ruthenium (Ru), chromium (Cr) or tungsten (W). The liner 24 may be deposited utilizing a conventional deposition process such as, for example, CVD, plasma enhanced chemical vapor deposition (PECVD), PVD or ALD. The liner 24 may be 10 nm thick, although a thickness less than or greater than 10 nm may be acceptable. The liner 24 may partially fill the second opening 20 along a lower surface and side surfaces of the second opening 20.

In a preferred embodiment, the liner 24 may include a non-magnetic (NM) conductive material and may have a preferred thickness, b, which corresponds to where there is the least amount of influence of a magnetic field between two magnetic layers through a non-magnetic layer. This corresponds to $t_{NM}$ equal to a value of a, where the value of $J_{IEC}$ which is the most negative, at the value of b, as described above in regards to the graph 1000.

Figure 6:
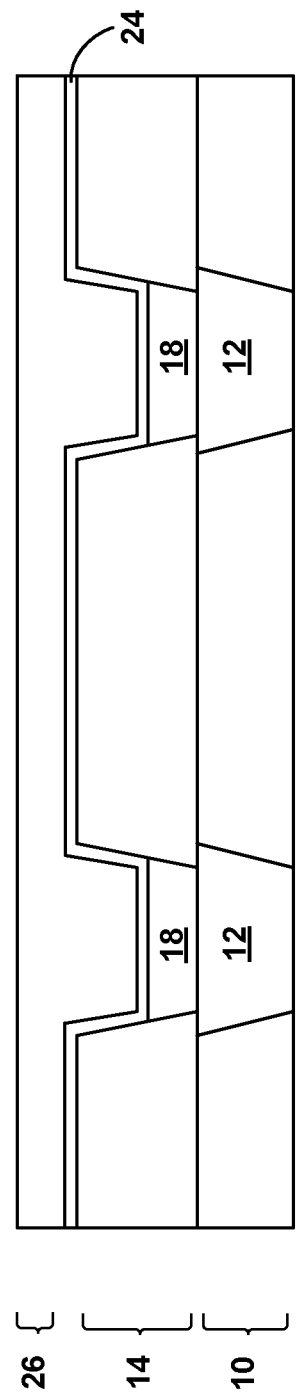
FIG. 6 illustrates forming a second via fill layer, according to an exemplary embodiment.

Referring now to FIG. 6, the structure 100 is shown according to an exemplary embodiment. A second via fill layer 26 may be formed.

The second via fill layer 26 may be formed within the second opening 20 in the via dielectric layer 14. In certain embodiments, the second via fill layer 26 may include a material defined and formed as the first via fill layer 18.

Figure 7:
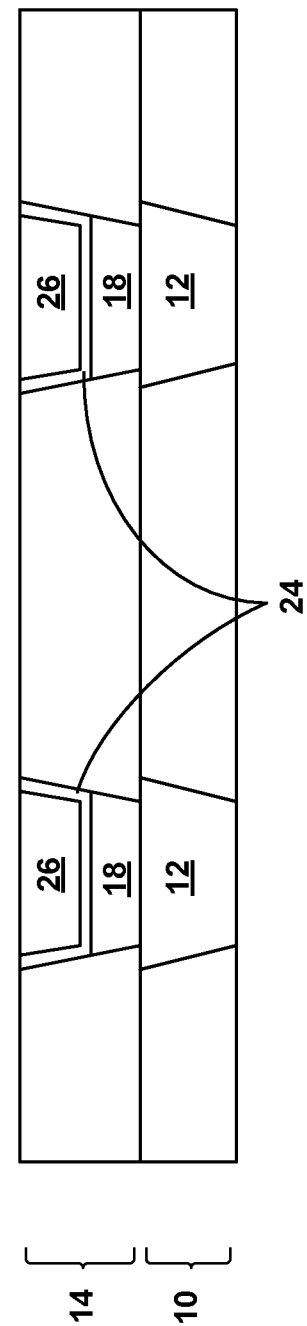
FIG. 7 illustrates planarization, according to an exemplary embodiment.

Referring now to FIG. 7, the structure 100 is shown according to an exemplary embodiment. A planarization of the structure 100 is performed.

The structure 100 is subjected to, for example, CMP to planarize the surface for further processing, such that upper horizontal surfaces of the second via fill layer 26, the via dielectric layer 14 and the liner 24 are coplanar.

In this preferred embodiment, the first via fill layer 18, the liner 24 and the second via fill layer 24 form an electrical connection in the via dielectric layer 14. The first via fill layer 18 and the second via fill layer 24 may include cobalt, which is a ferromagnetic material and may be susceptible to magnetization with a strong stray electromagnetic field. The liner 24 between the first via fill layer 18 and the second via fill layer 24 may be formed of a NM conductive material can help reduce stray electromagnetic fields in MTJ memory elements formed in layers above.

In particular, the second via fill layer 26 is aligned with the first via fill layer 18 and the BEOL metal layer 12, providing a via for an electrical connection through the via dielectric layer 14 to the BEOL metal layer 12. The via is a metal line which forms an electrical connection through the via dielectric layer 14 and is divided into two cobalt metal studs within the via dielectric layer 14. The first via fill layer 18 may be referred to as a lower metal stud and the second via fill layer 26 may be referred to as an upper metal stud.

Figure 8:
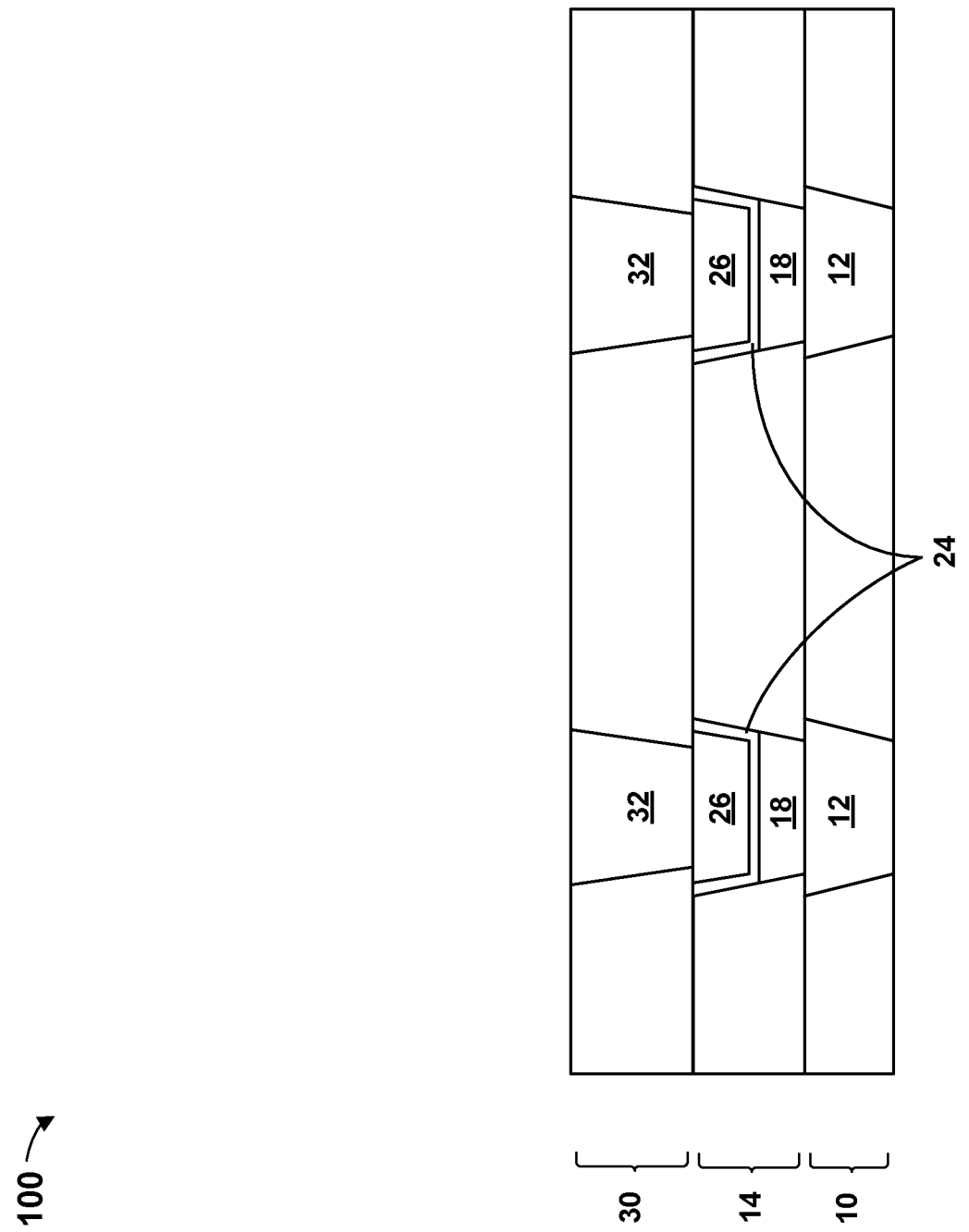
FIG. 8 illustrates forming a dielectric and a bottom electrode, according to an exemplary embodiment.

Referring now to FIG. 8, the structure 100 is shown according to an exemplary embodiment. A dielectric 30 and a bottom electrode 32 may be formed.

The dielectric 30 may conformally cover the via dielectric layer 14. The dielectric 30 may include one or more layers. The dielectric 30 may be formed and of a material as described above for the BEOL dielectric layer 10.

An opening (not shown) may be formed in the dielectric 30 as described above regarding the opening in the BEOL dielectric layer 10.

The bottom electrode 32 may be formed within the opening (not shown) in the dielectric 30, using known techniques. The bottom electrode 32 may be formed and include material as described above in regards to the BEOL metal layer 12. There may be any number of openings in the dielectric 30, each filled with the bottom electrode 32, on the structure 100.

In particular, the bottom electrode 32 is aligned with the second via fill layer 26, the first via fill layer 18 and the BEOL metal layer 12, providing an electrical connection between the bottom electrode 32, the second via fill layer 26, the first via fill layer 18 and the BEOL metal layer 12.

Figure 9:
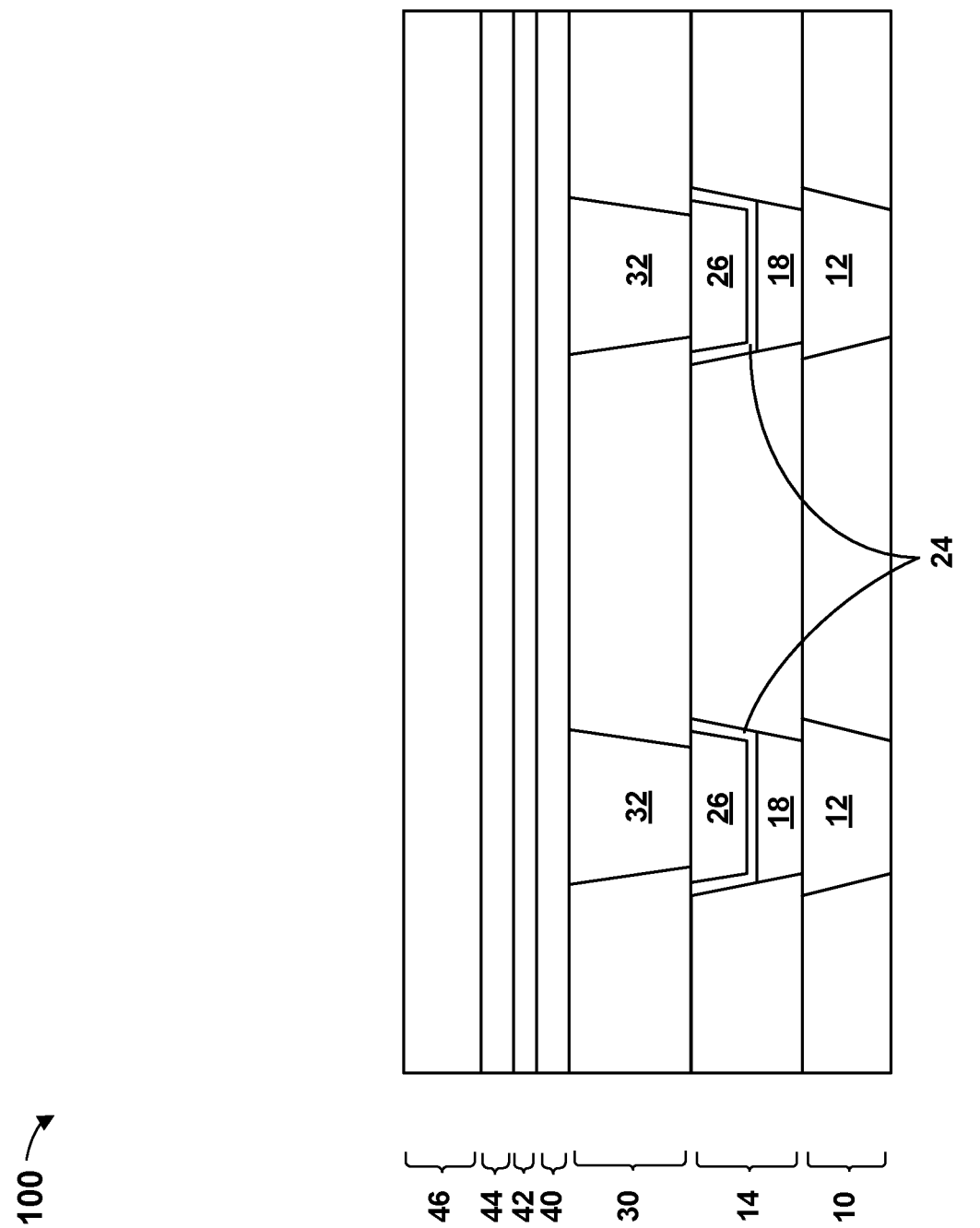
FIG. 9 illustrates forming magnetoresistive random-access memory ("MRAM") stack layers, according to an exemplary embodiment.

Referring now to FIG. 9, the structure 100 is shown according to an exemplary embodiment, magnetoresistive random-access memory ("MRAM") stack layers are formed, including a reference layer 40, a tunneling barrier 42, a free layer 44, and also a top electrode 46 is formed.

Each of the MRAM stack layers may be conformally formed on the structure 100 using known techniques. In formation of the MTJ stacks layers, the reference layer 40 is formed on the dielectric 30 and the bottom electrode 32. The tunneling barrier layer 42 is formed on the reference layer 40. In an embodiment, the tunneling barrier layer 42 is a barrier, such as a thin insulating layer or electric potential, between two electrically conducting materials. Electrons (or quasiparticles) pass through the tunneling barrier layer 42 by the process of quantum tunneling. In certain embodiments, the tunneling barrier layer 42 includes at least one sublayer composed of MgO. It should be appreciated that materials other than MgO can be used to form the tunneling barrier layer 42. The free layer 44 is a magnetic free layer that is adjacent to tunneling barrier layer 42 so as to be opposite the reference layer 40. The free layer 44 has a magnetic moment or magnetization that can be flipped. It should also be appreciated that the MTJ stack layers may include additional layers, omit certain layers, and each of the layers may include any number of sublayers. Moreover, the composition of layers and/or sublayers may be different between the different MRAM stacks.

The top electrode 38 may be conformally formed on the free layer 44, using known techniques. The top electrode 38 may be formed and include material as described above in regards to the BEOL metal layer 12.

Figure 10:
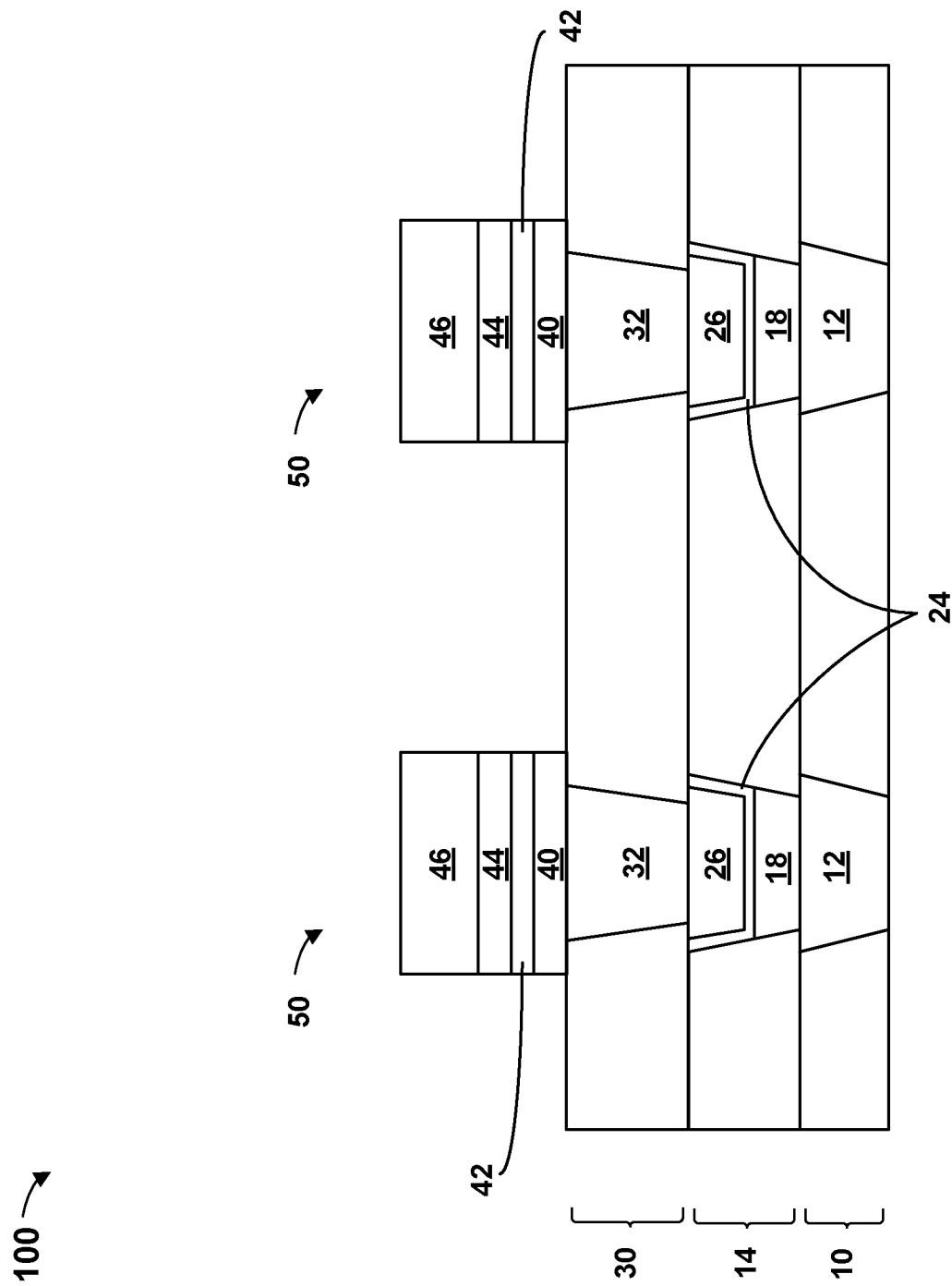
FIG. 10 illustrates forming a magnetic tunnel junction ("MTJ") stack, according to an exemplary embodiment.

Referring now to FIG. 10, the structure 100 is shown according to an exemplary embodiment. An MTJ stack 50 is formed.

The structure 100 may be patterned and etched using known techniques to form the MTJ stack 50. As shown in the Figures, two MTJ stacks 50 are formed, however any number of MTJ stacks 50 may be formed. The MTJ stack 50 may be patterned in one or more steps by lithography and ion beam etch (IBE) or RIE. Aligned vertical portions of the top electrode 46, the free layer 44, the tunneling barrier layer 42 and the reference layer 40 may be removed selective to the dielectric 30. Remaining vertical portions of the top electrode 46, the free layer 44, the tunneling barrier layer 42 and the reference layer 40 may form the MTJ stack 50, and may be aligned over the bottom electrode 32, the second via fill layer 26, the first via fill layer 18 and the BEOL metal layer 12.

Figure 11:
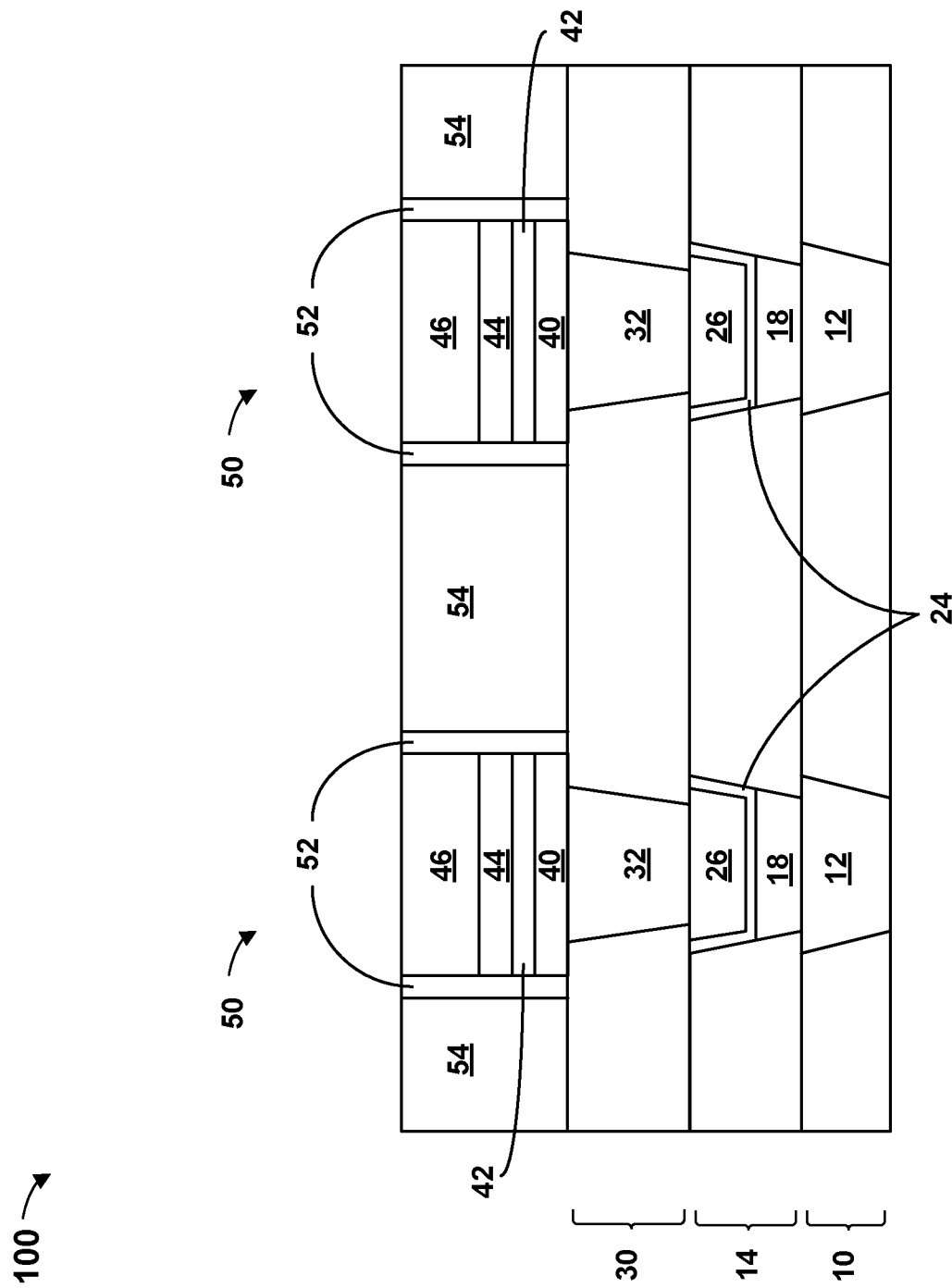
FIG. 11 illustrates forming sidewall spacers and an upper dielectric, according to an exemplary embodiment.

Referring now to FIG. 11, the structure 100 is shown according to an exemplary embodiment. Sidewall spacers 52 and an upper dielectric 54 may be formed.

The sidewall spacers 52 may be conformally formed on the structure 100, on an exposed upper surface of the dielectric 30, and on vertical side surfaces of the top electrode 46, the free layer 44, the tunneling barrier layer 42 and the reference layer 40. The sidewall spacers 52 may be formed by PVD, ALD, PECVD, among other methods. The material of the sidewall spacers 52 may include silicon nitride (SiN), aluminum oxide ($AlO_x$), titanium oxide ($TiO_x$), silicon oxide ($SiO_x$), boron nitride (BN), silicon boron carbonitride (SiBCN), or any combination thereof.

In a preferred embodiment, the sidewall spacers 52 may have an optional pre-treatment with plasma oxygen (O), hydrogen (H), nitrogen (N) or ammonia ($NH_3$), or any combination thereof.

Patterning of the structure 100 may be performed using known techniques to remove the sidewall spacers 52 from an upper surface of the dielectric 30 and an upper surface of the top electrode 46, selective to each of these layers, such that a remaining portion of the sidewall spacers 52 remain on vertical side surfaces of the top electrode 46, the free layer 44, the tunneling barrier layer 42 and the reference layer 40.

The upper dielectric 54 may conformally formed on the structure 100, on an exposed upper surface of the dielectric 30 and the top electrode 46, and on vertical side surfaces of the sidewall spacers 52. The upper dielectric 54 may include one or more layers. The upper dielectric 54 may be formed and of a material as described above for the BEOL dielectric layer 10.

A chemical mechanical polishing (CMP) technique may be used to remove excess material and polish upper surfaces of the structure 100 such that upper horizontal surfaces of the upper dielectric 54, the sidewall spacer 52 and the top electrode 46 and are coplanar.

The resulting structure 100 includes an MTJ stack 50 which is formed over a via dielectric layer 14, where the via dielectric layer 14 has openings for electrical connections which are filled with the first via fill layer 18 separated by the second via fill layer 26 by the liner 24. Both the first via fill layer 18 and the second via fill layer 26 are within the via dielectric layer 14 and are both made with a ferromagnetic material, specifically cobalt. The liner 24 may be made of a NM material and may have a thickness, t, which corresponds to where there is the least amount of influence of a magnetic field between the two magnetic layers, the first via fill layer 18 and the second via fill layer 26. The liner 24 is a NM layer within the cobalt layer and reduces stray electromagnetic fields which could negatively affect the MTJ stack 50.

The metal line which forms an electrical connection through the via dielectric layer 14 is divided into two cobalt metal studs within the via dielectric layer 14. This method of dividing a cobalt metal line can be applied to contacts, vias, and other conductive structures made of cobalt. In the structure 100, the method of dividing a cobalt metal line could be applied to the BEOL metal layer 12 of the first BEOL layer, and other cobalt conductive structures in the structure 100.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a via dielectric layer sandwiched between a metal line layer and a bottom electrode of a magnetic tunnel junction (MTJ) stack;
   a via in the via dielectric layer, wherein the via comprises an upper metal stud and a lower metal stud, wherein the upper metal stud and the lower metal stud each comprise cobalt;
   a liner surrounding a lower horizontal surface and vertical side surfaces of the upper metal stud, wherein the liner is sandwiched between the upper metal stud and the lower metal stud, wherein the liner comprises a non-ferromagnetic conductive material, wherein a thickness of the liner corresponds to a least amount of influence of a magnetic field through the non-ferromagnetic conductive material of the liner between the upper metal stud and the lower metal stud.

2. The semiconductor device according to claim 1, wherein material of the liner is selected from the group consisting of ruthenium (Ru), chromium (Cr), tungsten (W), and combinations thereof.

3. The semiconductor device according to claim 1, wherein the metal line layer comprises a metal line layer dielectric and a metal line, the metal line vertically aligned with the via.

4. A semiconductor device comprising:
   a via between a metal line layer and a bottom electrode of a magnetic tunnel junction (MTJ) stack, wherein the via comprises an upper metal stud and a lower metal stud, wherein the upper metal stud and the lower metal stud each comprise cobalt;
   a liner surrounding a lower horizontal surface and vertical side surfaces of the upper metal stud, wherein the liner is sandwiched between the upper metal stud and the lower metal stud, wherein the liner comprises a non-ferromagnetic conductive material, wherein a thickness of the liner corresponds to a least amount of influence of a magnetic field through the non-ferromagnetic conductive material of the liner between the upper metal stud and the lower metal stud.

5. The semiconductor device according to claim 4, wherein material of the liner is selected from the group consisting of ruthenium (Ru), chromium (Cr), tungsten (W), and combinations thereof.

6. The semiconductor device according to claim 4, wherein the metal line layer comprises a metal line layer dielectric and a metal line, the metal line vertically aligned with the via.

7. A semiconductor device comprising:
   a bottom electrode of a magnetic tunnel junction (MTJ) stack;
   a via vertically aligned below the bottom electrode, wherein the via comprises an upper metal stud and a lower metal stud, wherein the upper metal stud and the lower metal stud each comprise cobalt;
   a liner surrounding a lower horizontal surface and vertical side surfaces of the upper metal stud, wherein the liner is sandwiched between the upper metal stud and the lower metal stud, wherein the liner comprises a non-ferromagnetic conductive material, wherein a thickness of the liner corresponds to a least amount of influence of a magnetic field through the non-ferromagnetic conductive material of the liner between the upper metal stud and the lower metal stud.

8. The semiconductor device according to claim 7, wherein material of the liner is selected from the group consisting of ruthenium (Ru), chromium (Cr), tungsten (W), and combinations thereof.

9. The semiconductor device according to claim 7, further comprising:
   a metal line layer below the via, the metal line layer comprising a metal line layer dielectric and a metal line, the metal line vertically aligned with the via.

* * * * *